United States Patent
Li et al.

(10) Patent No.: US 10,632,727 B2
(45) Date of Patent: *Apr. 28, 2020

(54) METHOD OF TRANSFERRING MICRO DEVICES

(71) Applicant: PlayNitride Inc., Tainan (TW)

(72) Inventors: Yun-Li Li, Tainan (TW); Tzu-Yang Lin, Tainan (TW); Yu-Hung Lai, Tainan (TW); Pei-Hsin Chen, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/045,748

(22) Filed: Jul. 26, 2018

(65) Prior Publication Data

US 2018/0333945 A1   Nov. 22, 2018

Related U.S. Application Data

(63) Continuation-in-part of application No. 15/612,839, filed on Jun. 2, 2017.

(30) Foreign Application Priority Data

Apr. 10, 2017  (TW) .............................. 106111839 A (51) Int. Cl.
*H01L 33/40* (2010.01)
*H01L 21/683* (2006.01)
(Continued)

(52) U.S. Cl.
CPC .............. *B32B 38/10* (2013.01); *B32B 37/12* (2013.01); *H01L 21/6835* (2013.01);
(Continued)

(58) Field of Classification Search
None
See application file for complete search history.

(56) References Cited

U.S. PATENT DOCUMENTS

2013/0210194 A1* 8/2013 Bibl .................. H01L 24/83
                                                       438/107
2016/0144608 A1   5/2016 Chang
2017/0170049 A1   6/2017 Hu et al.

FOREIGN PATENT DOCUMENTS

TW           201023243         6/2010

OTHER PUBLICATIONS

"Office Action of Taiwan Counterpart Application," dated Mar. 7, 2019, p. 1-p. 6.

* cited by examiner

*Primary Examiner* — Asok K Sarkar
(74) *Attorney, Agent, or Firm* — JCIPRNET (57) ABSTRACT

A method of transferring micro devices is provided. A carrier substrate including a buffer layer and a plurality of micro devices is provided. The buffer layer is located between the carrier substrate and the micro devices. The micro devices are separated from one another and positioned on the carrier substrate through the buffer layer. A receiving substrate contacts the micro devices disposed on the carrier substrate. A temperature of at least one of the carrier substrate and the receiving substrate is changed after the micro devices contact the receiving substrate. At least a portion of the micro devices are transferred from the carrier substrate onto the receiving substrate after changing the temperature of at least one of the carrier substrate and the receiving substrate.

19 Claims, 11 Drawing Sheets

(51) Int. Cl.
*H01L 27/15* (2006.01)
*B32B 38/10* (2006.01)
*B32B 37/12* (2006.01)
*H01L 23/00* (2006.01)
*H01L 33/00* (2010.01)
*H01L 25/075* (2006.01)
*H01L 33/62* (2010.01)
*H01L 25/16* (2006.01)

(52) U.S. Cl.
CPC .............. *H01L 24/75* (2013.01); *H01L 24/83* (2013.01); *H01L 25/0753* (2013.01); *H01L 27/156* (2013.01); *H01L 33/0079* (2013.01); *H01L 33/40* (2013.01); *H01L 25/167* (2013.01); *H01L 33/62* (2013.01); *H01L 2221/68322* (2013.01); *H01L 2221/68363* (2013.01); *H01L 2221/68381* (2013.01); *H01L 2224/73253* (2013.01); *H01L 2224/81* (2013.01); *H01L 2224/95* (2013.01)

METHOD OF TRANSFERRING MICRO DEVICES

CROSS-REFERENCE TO RELATED APPLICATION

This application is a continuation-in-part application of and claims the priority benefit of a prior application Ser. No. 15/612,839, filed on Jun. 2, 2017, now allowed. The prior application Ser. No. 15/612,839 claims the priority benefit of Taiwan application serial no. 106111839, filed on Apr. 10, 2017. The entirety of each of the above-mentioned patent applications is hereby incorporated by reference herein and made a part of this specification.

BACKGROUND OF THE INVENTION

Field of the Invention

The invention relates to a method of transferring micro devices, particularly to a method capable of bulk transferring micro devices.

Description of Related Art

In present days, light emitting diodes (LEDs) on a carrier substrate can be transferred onto a receiving substrate through a force at a distance such as electrostatic force or magnetic force. The number of the LEDs that can be transferred through the abovementioned method, however, is limited by the size of an electrostatic head or a magnetic head. The transferring efficiency thus cannot be effectively increased and the need for bulk transfer cannot be satisfied. Moreover, in the abovementioned method, the LEDs on the carrier substrate must be first picked up by static electricity or magnetic force through contact with the electrostatic head or the magnetic head and then transferred and positioned on the receiving substrate; afterwards, the LEDs are released onto the receiving substrate by removing the force at a distance such as electrostatic force or magnetic force. The aforementioned steps of transferring the LEDs are so complicated that it is difficult to improve efficiency in transferring the LEDs.

SUMMARY OF THE INVENTION

The invention provides a method of transferring micro devices, which achieves bulk transfer of micro devices and has an advantage of high transferring efficiency.

The method of transferring micro devices includes steps as follows. A carrier substrate is provided on which a buffer layer and a plurality of micro devices are disposed. The buffer layer is located between the carrier substrate and the micro devices. The micro devices are separated from one another and are positioned on the carrier substrate through the buffer layer. A receiving substrate is made to contact the micro devices on the carrier substrate. A temperature of at least one of the carrier substrate and the receiving substrate is changed after the micro devices contact the receiving substrate. At least a portion of the micro devices are transferred from the carrier substrate onto the receiving substrate after changing the temperature of at least one of the carrier substrate and the receiving substrate.

Based on the above, the method of transferring micro devices in the invention is as follows. The receiving substrate is made to contact the micro devices on the carrier substrate. Then, by changing the temperature of at least one of the carrier substrate and the receiving substrate, the micro devices in a number ranging from 1000 to 2000000 are simultaneously released from the carrier substrate and transferred onto the receiving substrate. Compared with the conventional method of transferring LEDs through a force at a distance such as electrostatic force or magnetic force, the method of transferring micro devices in the invention achieves bulk transfer of micro devices and has an advantage of high transferring efficiency.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
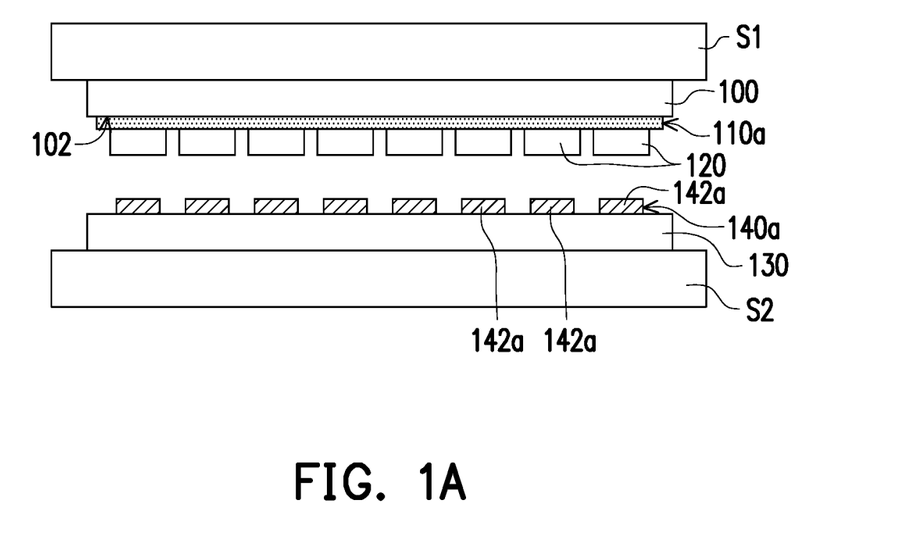
FIG. 1A to FIG. 1C are schematic cross-sectional views of a method of transferring micro devices in an embodiment of the invention.
Figure 1B:
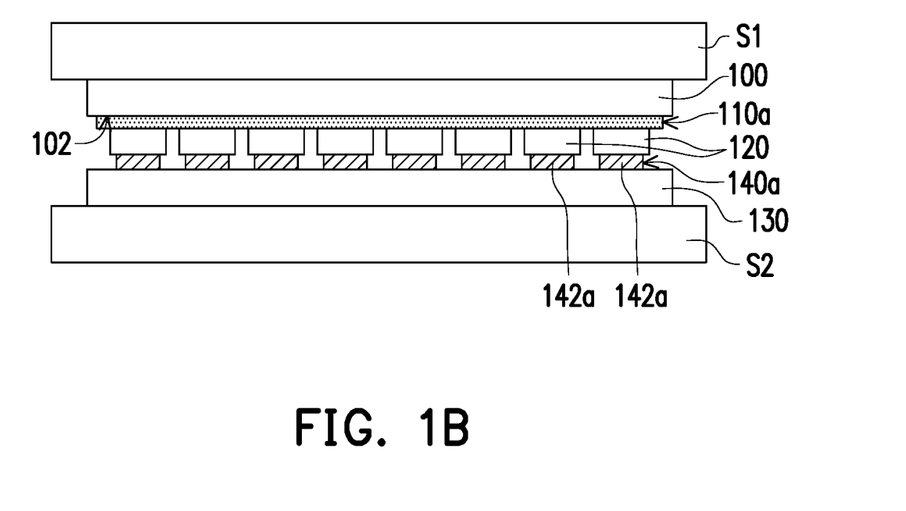
Figure 1C:
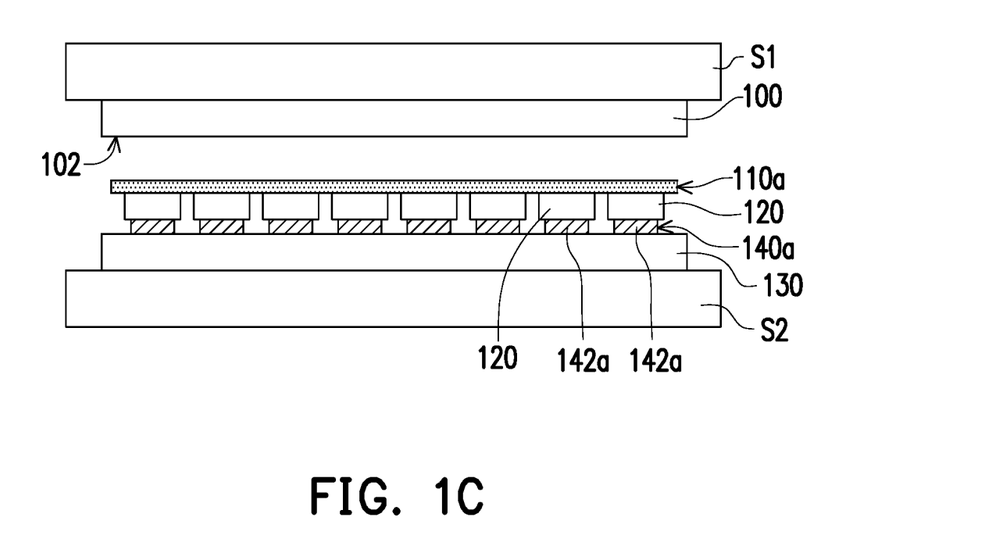

FIG. 1A to FIG. 1C are schematic cross-sectional views of a method of transferring micro devices in an embodiment of the invention. Please first refer to FIG. 1A. According to the method of transferring micro devices of the present embodiment, a carrier substrate 100 is provided first. A buffer layer 110a and a plurality of micro devices 120 are disposed on the carrier substrate 100, wherein the buffer layer 110a is located between the carrier substrate 100 and the micro devices 120, and the micro devices 120 are separated from one another and are positioned on the carrier substrate 100 through the buffer layer 110a.

More specifically, surface roughness of the carrier substrate 100 of the present embodiment is, for example, smaller than 2.5 μm and preferably in a range from 0.01 μm to 2 μm. A material of the carrier substrate 100 is an inorganic material such as a sapphire substrate or a glass substrate. Nevertheless, the invention is not limited to the above. The surface roughness of the carrier substrate 100 is controlled to be smaller than 2.5 μm so that the micro devices 120 have uniform horizontal heights and stability of a manufacturing process of the micro devices 120 is improved. As shown in FIG. 1A, the buffer layer 110a entirely covers a lower surface 102 of the carrier substrate 100. The buffer layer 110a may be taken as a buffer structure. A material of the buffer layer 110a is an organic material such as a macromolecular polymer having viscosity and formed by thermal curing or UV curing, and examples thereof include epoxy resin, polyimide, polyester, polyurethane, benzocyclobutene, polyethylene, polypropylene, polyacrylate, and a combination thereof. That is to say, the buffer layer 110a may possess both adhering and buffering functions. Furthermore, the buffer layer 110a may be a single-layered structure or a multi-layered structure. For example, the buffer layer 110a may be a double-layered structure of two types of macromolecular materials or a multi-layered structure obtained by alternately stacking two types of macromolecules. Nevertheless, the invention is not limited to the above. Additionally, the material of the buffer layer 110a of the present embodiment may also be a metal or a an alloy with a melting point of lower than 200 degree Celsius, and examples thereof include indium, an indium-bismuth alloy, a tin-bismuth alloy, a lead-tin alloy, a zinc-tin alloy, etc. Nevertheless, the invention is not limited to the above. Hardness of the carrier substrate 100 is greater than hardness of the buffer layer 110a, and hardness of the micro devices 120 is greater than the hardness of the buffer layer 110a. A Young's modulus of the buffer layer 110a is smaller than 10 GPa, a Young's modulus of the carrier substrate 100 is greater than 20 GPa, and Young's moduli of the micro devices 120 are greater than 20 GPa.

As shown in FIG. 1A, the micro devices 120 of the present embodiment are positioned on the carrier substrate 100 in an array arrangement through the buffer layer 110a. The micro devices 120 expose a portion of the buffer layer 110a. In other words, a portion of the buffer layer 110a is exposed between two adjacent micro devices 120. The micro devices 120 herein are, for example, inorganic LEDs such as lateral LEDs or vertical LEDs. Preferably, a maximum width of each of the micro devices 120 is in a range from 3 μm to 100 μm. That is to say, the micro devices 120 of the present embodiment are specifically micro LEDs.

Next, please again refer to FIG. 1A, a receiving substrate 130 is provided and is specifically a thin film transistor (TFT) substrate. In other embodiments, the receiving substrate 130 may be a glass substrate, a ceramic substrate, a semiconductor substrate, a submount, a complementary metal-oxide-semiconductor (CMOS) circuit substrate, a liquid-crystal-on-silicon (LCOS) substrate, or other substrates with a driving unit.

It should be explained that, in the present embodiment, the carrier substrate 100 may be disposed on a first supporting board S1 and the receiving substrate 130 may be disposed on a second supporting board S2 in order to enhance structural strength of the carrier substrate 100 and the receiving substrate 130. The first supporting board S1 may be a supporting board with or without a heating function. The second supporting board S2 may be a supporting board with or without a heating function.

Next, please refer to FIG. 1A and FIG. 1B together. The receiving substrate 130 is made to contact the micro devices 120 on the carrier substrate 100. In the present embodiment, the step of making the receiving substrate 130 contact the micro devices 120 on the carrier substrate 100 includes: a bonding layer 140a is provided between the micro devices 120 and the receiving substrate 130, wherein the micro devices 120 contact the receiving substrate 130 through the bonding layer 140a. Herein, the bonding layer 140a specifically includes a plurality of bonding parts 142a corresponding to the micro devices 120. The bonding parts 142a are formed on the receiving substrate 130. Nevertheless, the invention is not limited to the above. In other words, the micro devices 120 are interposed between the buffer layer 110a disposed on the carrier substrate 100 and the bonding layer 140a formed on the receiving substrate 130. Herein, a material of the bonding layer 140a may be identical to the material of the buffer layer 110a. By the carrier substrate 100 and the receiving substrate 130 having different temperatures from each other, the buffer layer 110a and the bonding layer 140a may be in different states. For example, when the buffer layer 110a is in a liquid state and the bonding layer 140a is in a solid state, i.e., the buffer layer 110a and the bonding layer 140a are present in different states, the micro devices 120 do not slide and are not displaced when being transferred. As a result, the micro devices 120 are released from the carrier substrate 100 and can accurately be transferred to corresponding positions on the receiving substrate 130. Additionally, the material of the bonding layer 140a may also differ from the material of the buffer layer 110a. The material of the bonding layer 140a is not limited, and may be a metal or a macromolecular polymer. A material capable of bonding the micro devices 120 with the receiving substrate 130 and a material suitably selected according to the melting point of the material of the buffer layer 110a may both be used as the material of the bonding layer 140a.

Since the hardness of the buffer layer 110a is smaller than the hardness of the carrier substrate 100 and the hardness of the micro devices 120, the carrier substrate 100 and the micro devices 120 with greater hardness are not damaged when the receiving substrate 130 contacts the micro devices 120 on the carrier substrate 100, and an yield rate of the micro devices 120 after transfer is therefore ensured. Moreover, the Young's modulus of the buffer layer 110a is smaller than the Young's modulus of the carrier substrate 100 and the Young's moduli of the micro devices 120. In other words, the buffer layer 110a has higher flexibility, such that a stress caused by a contact between the receiving substrate 130 and the micro devices 120 on the carrier substrate 100 may be absorbed by the buffer layer 110a. As a result, the micro devices 120 are transferred accurately to predetermined positions and the yield rate problem caused by displacement of the micro devices 120 is reduced. Preferably, the Young's modulus of the buffer layer 110a falls into a range from 0.01 GPa to 10 GPa and the Young's moduli of the micro devices 120 and the carrier substrate 100 fall into a range from 20 GPa to 300 GPa.

It should be explained that the bonding parts 142a of the bonding layer 140a as shown herein is an exemplary structure and should be designed in accordance with the structure of the micro devices 120. For example, when the micro devices 120 are specifically lateral LEDs, the bonding parts 142a should be formed into two parts separated from each other in accordance with two electrodes of the micro devices 120. When the micro devices 120 are specifically vertical LEDs, the bonding parts 142a should be for lied in the state as shown in FIG. 1A to FIG. 1C in accordance with one electrode of the micro devices 120. Additionally, a number of the bonding parts 142a of the bonding layer 140a of the present embodiment is substantially identical to a number of the micro devices 120. Therefore, all of the micro devices 120 of the present embodiment may be transferred onto the bonding parts 142a of the bonding layer 140a formed on the receiving substrate 130. Particularly, in the present embodiment, the number of the micro devices 120 transferred onto the receiving substrate 130 is preferably in a range from 1000 to 2000000.

In the present embodiment, before the micro devices 120 are brought in contact with the receiving substrate 130 and the bonding layer 140a, the temperature of at least one of the carrier substrate 100 and the receiving substrate 130 may be changed. For example, the temperature of the carrier substrate 100 is raised to reduce bonding force between the at least a portion of the micro devices 120 and the carrier substrate 100. Here, the temperature of the carrier substrate 100 may be raised by heating through the first supporting board S1. When the temperature of the carrier substrate 100 increases, the buffer layer 110a is present in a molten state due to its material characteristics. The bonding force between the micro devices 120 and the carrier substrate 100 is thereby reduced, such that the micro devices 120 may be easily transferred onto the receiving substrate 130 in the subsequent process. In some embodiments, the temperature of the receiving substrate 130 may also be raised to liquefy the bonding layer 140a. Here, the temperature of the receiving substrate 130 may be raised by heating the receiving substrate 130 through the second supporting board S2. When the temperature of the receiving substrate 130 increases, the bonding layer 140a is liquefied due to its material characteristics. With the liquefied bonding layer 140a, the receiving substrate 130 is able to easily receive the micro devices 120 in the subsequent process. The temperature of the carrier substrate 100 may be elevated in a ramping manner. In other words, the temperature of the carrier substrate 100 is raised discretely. For example, the temperature of the carrier substrate 100 may be raised to a first predetermined temperature. Subsequently, the carrier substrate 100 is kept at the first predetermined temperature for a first period. Thereafter, the temperature of the carrier substrate 100 is further raised to a second predetermined temperature higher than the first predetermined temperature. Then, the carrier substrate 100 is being kept at the second predetermined temperature for a second period. The foregoing process may be repeated several times to realize ramp heating. However, the invention is not limited thereto. In some alternative embodiments, the temperature of the carrier substrate 100 may be elevated in a continuous manner. In other words, the temperature of the carrier substrate 100 may be raised continuously. In the present embodiment, a change in temperature of the carrier substrate 100 during this step is less than or equal to 100 degree Celsius to avoid drastic reduction of the bonding force between the micro devices 120 and the carrier substrate 100, so as to ensure the micro devices 120 still remain on the carrier substrate 100. It should be noted that the foregoing process may be referred to as a pre-heating process. Although the present embodiment includes the pre-heating process, the invention is not limited thereto. In some alternative embodiments, the pre-heating process may be omitted.

Finally, please refer to FIG. 1C. The temperature of at least one of the carrier substrate 100 and the receiving substrate 130 is further changed after the micro devices 120 are made in contact with the receiving substrate 130 and the bonding layer 140a, such that a least a portion of the micro devices 120 are released from the carrier substrate 100 and transferred onto the receiving substrate 130. More specifically, the step of changing the temperature of at least one of the carrier substrate 100 and the receiving substrate 130 includes: first, the temperature of the carrier substrate 100 is raised to reduce bonding force between the at least a portion of the micro devices 120 and the carrier substrate 100. Here, the temperature of the carrier substrate 100 may be raised by heating through the first supporting board S1, or by heating through the second supporting board S2 by means of a heat conduction mechanism. When the temperature of the carrier substrate 100 increases, the buffer layer 110a is present in a molten state due to its material characteristics. The bonding force between the micro devices 120 and the carrier substrate 100 is thereby reduced, such that the micro devices 120 are released from the substrate 100 and transferred onto the receiving substrate 130. Similar to the pre-heating step, during this step, the temperature of the carrier substrate 100 may be elevated in a ramping manner. By changing the temperature of the carrier substrate 100 in a ramping manner, drastic reduction of the bonding force between the micro devices 120 and the carrier substrate 100 within a short period of time may be sufficiently alleviated, thereby avoiding shift of the micro devices 120 due to the reduction of the bonding force. As a result, the bonding precision may be ensured. However, the invention is not limited thereto. In some alternative embodiments, the temperature of the carrier substrate 100 may be elevated in a continuous manner.

In the present embodiment, when the temperature of the carrier substrate 100 is raised to reduce the bonding force after the micro devices 120 contact the bonding layer 140a and the receiving substrate 130, a pressure may be applied to the carrier substrate 100 at the same time. The pressure may be applied to the carrier substrate 100 in a ramping manner. For example, a first predetermined pressure may be applied to the carrier substrate 100 for a first period. Subsequently, the pressure applied to the carrier substrate 100 may be increased. For example, a second predetermined pressure higher than the first predetermined pressure may be applied to the carrier substrate 100 for a second period. The foregoing process may be repeated several times to apply pressure onto the carrier substrate 100 in a ramping manner. However, the invention is not limited thereto. In some alternative embodiments, the pressure applied to the carrier substrate 100 may be increased in a continuous manner. By applying pressure to the carrier substrate 100 during the transferring process, the bonding between the micro devices 120 and the receiving substrate 130 may be more secure, thereby increasing the transfer rate of the micro devices 120.

In addition to the steps mentioned above, a step of bonding the micro devices 120 with the receiving substrate 130 may be further included. The details are as follows: the temperature of the receiving substrate 130 is raised to liquefy the bonding layer 140a. Here, the temperature of the receiving substrate 130 may be raised by heating the receiving substrate 130 through the second supporting board S2. When the temperature of the receiving substrate 130 increases, the bonding layer 140a is liquefied due to its material characteristics. Finally, an annealing process should be performed on the receiving substrate 130 to turn the bonding layer 140a from the liquid state to the solid state, so as to enhance the bonding force between the micro devices 120 and the receiving substrate 130. In the present embodiment, the step of raising the temperature of the carrier substrate 100 and the step of raising the temperature of the receiving substrate 130 after the micro devices 120 are made in contact with the bonding layer 140a and the receiving substrate 130 may be collectively referred to as a main heating process.

In some embodiments, a change in temperature of at least one of the carrier substrate 100 and the receiving substrate 130 before making the receiving substrate 130 contact the micro devices 120 on the carrier substrate 100 is different from a change in temperature of the at least one carrier substrate 100 and the receiving substrate 130 after making the receiving substrate 130 contact the micro devices 120 on the carrier substrate 100. In other words, the change in temperature during the pre-heating process is different from the change in temperature during the main heating process. For example, the change in temperature during the pre-heating process may be smaller than the change in temperature during the main heating process.

Additionally, a material having viscosity may instead be used as the bonding layer 140a. The viscosity of the material is sufficient so that an adhesive force between the micro devices 120 and the bonding layer 140a is greater than the bonding force between the micro devices 120 and the carrier substrate 100. Therefore, the micro devices 120 are bonded onto the receiving substrate 130 through the bonding layer 140a.

Further, after the temperature of at least one of the carrier substrate 100 and the receiving substrate 130 is changed, the temperature of the carrier substrate 100 differs from the temperature of the receiving substrate 130. Preferably, the temperature of the carrier substrate 100 is raised to a range from 50 degree Celsius to 200 degree Celsius, while the temperature of the receiving substrate 130 is raised to a range from 80 degree Celsius to 280 degree Celsius. More specifically, if the material of the bonding layer 140a is identical to the material of the buffer layer 110a, a melting point temperature of the buffer layer 110a is Tmr, the temperature of the carrier substrate 100 is Tc, and the temperature of the receiving substrate 130 is Tr, then Tr<Tmr<Tc. That is to say, when the bonding layer 140a and the buffer layer 110a adopt the same material, the melting point temperature Tmc of the buffer layer 110a should fall between the temperature Tr of the receiving substrate 130 and the temperature Tc of the carrier substrate 100. In this way, the micro devices 120 on the carrier substrate 100 can be transferred onto the receiving substrate 130 due to a temperature difference between the carrier substrate 100 and the receiving substrate 130.

On the other hand, if the material of the bonding layer 140a differs from the material of the buffer layer 110a, the melting point temperature of the bonding layer 140a is Tmr, a melting point temperature of the buffer layer 110a is Tmc, the temperature of the carrier substrate 100 is Tc, and the temperature of the receiving substrate 130 is Tr, then Tc>Tmc and Tr<Tmr. That is to say, when the bonding layer 140a and the buffer layer 110a adopt different materials, the temperature Tc of the carrier substrate 100 should be higher than the melting point temperature Tmc of the buffer layer 110a, so as to effectively cause the buffer layer 110a to be present in the molten state due to its material characteristics. The bonding force between the micro devices 120 and the carrier substrate 100 is thereby reduced. The temperature Tr of the receiving substrate 130 should be lower than the melting point temperature Tmr of the bonding layer 140a, such that the micro devices 120 are transferred to the receiving substrate 130.

After the temperature of at least one of the carrier substrate 100 and the receiving substrate 130 is changed, the carrier substrate 100 and the first supporting board S1 may be removed from the micro devices 120 to ensure the micro devices 120 are readily transferred from the carrier substrate 100 onto the receiving substrate 130. For example, after the micro devices 120 contact the bonding parts 142a, the carrier substrate 100 may be detached from the buffer layer 110a. The carrier substrate 100 may be removed through, for example, a laser ablation process, an ultraviolet light irradiating process, a solution decomposition process, a thermal decomposition process, a combination thereof, or the like. However, the invention is not limited thereto. In some alternative embodiments, other stripping methods may be adapted to remove the carrier substrate 100.

Briefly, the method of transferring micro devices of the present embodiment is as follows. First, at least one of the carrier substrate 110 and the receiving substrate 130 may be pre-heated. Subsequently, the receiving substrate 130 is made to contact the micro devices 120 on the carrier substrate 100 that are in a number ranging from 1000 to 2000000. Then, the micro devices 120 are released from the carrier substrate 100 and transferred onto the receiving substrate 130 due to the temperature difference between the carrier substrate 100 and the receiving substrate 130, thereby completing a transfer of the micro devices. Compared with the conventional transferring process of LEDs performed through the force at a distance such as electrostatic force or magnetic force, the method of transferring micro devices of the present embodiment is capable of transferring 1000 to 2000000 micro devices at once, thereby achieving bulk transfer of the micro devices 120, and also has an advantage of high transferring efficiency.

It should be explained here that the following embodiments continue to use the reference numerals and partial contents of the previous embodiment, wherein the same reference numerals are used to indicate the same or similar elements, and descriptions of the same technical contents are omitted. Please refer to the above embodiment for the omitted part of description, which will not be repeated in the following embodiments.

Figure 2A:
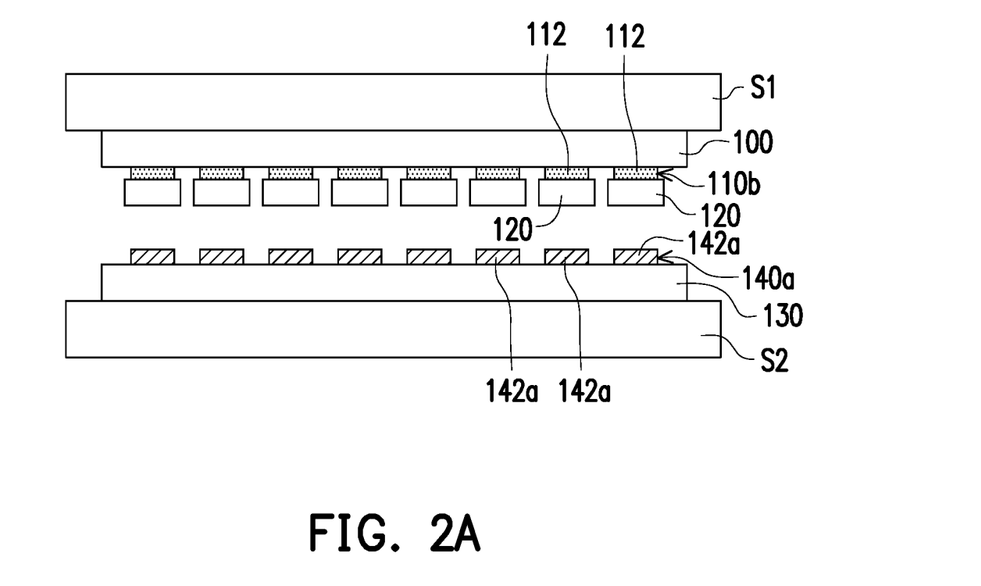
FIG. 2A to FIG. 2C are schematic cross-sectional views of a method of transferring micro devices in another embodiment of the invention.
Figure 2B:
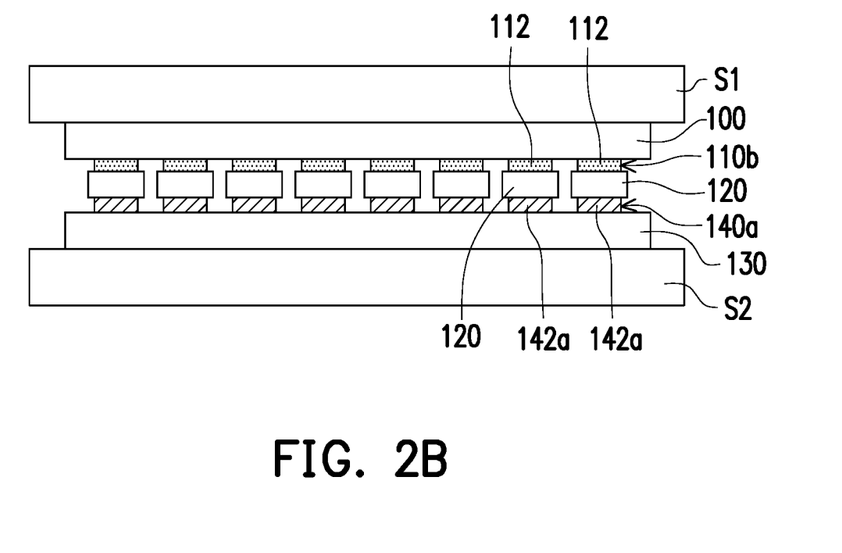
Figure 2C:
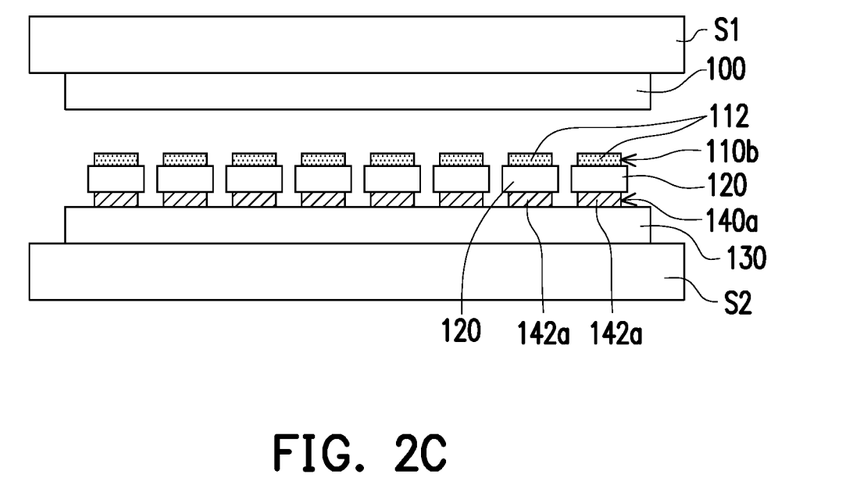

FIG. 2A to FIG. 2C are schematic cross-sectional views of a method of transferring micro devices in another embodiment of the invention. Please refer to FIG. 2A and FIG. 1A together. The transfer of micro devices of the present embodiment is similar to the transfer of micro devices in FIG. 1A. A difference between them lies in: in the step of providing the carrier substrate 100, a buffer layer 110b of the present embodiment includes a plurality of buffer parts 112 corresponding to the micro devices 120. The buffer parts 112 are separated from one another and expose a portion of the carrier substrate 100. Herein, a number of the buffer parts 112 is substantially identical to the number of the micro devices 120, and the number of bonding parts 142a of the bonding layer 140a is identical to the number of the micro devices 120. Particularly, areas of orthographic projections of the buffer parts 112 on the carrier substrate 100 completely overlap and are smaller than areas of orthographic projections of the corresponding micro devices 120 on the carrier substrate 100, so that the buffer parts 112 may provide a better buffering effect when the micro devices 120 are being transferred.

Next, please refer to FIG. 2B. Similarly to the step in FIG. 1, the receiving substrate 130 is made to contact the micro devices 120 on the carrier substrate 100. Herein, the micro devices 120 on the carrier substrate 100 respectively contact the bonding parts 142a of the bonding layer 140a on the receiving substrate 130. Then, please refer to FIG. 2C. Similarly to the step in FIG. 1C, the temperatures of the carrier substrate 100 and the receiving substrate 130 are changed. Due to the temperature difference between the carrier substrate 100 and the receiving substrate 130, the micro devices 120 are all released from the carrier substrate 100 onto the receiving substrate 130.

Figure 3A:
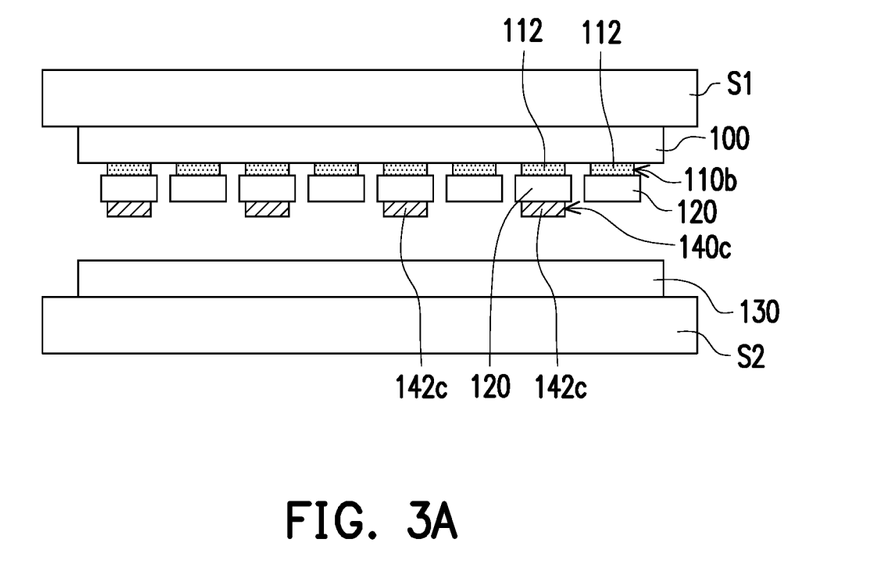
FIG. 3A to FIG. 3C are schematic cross-sectional views of a method of transferring micro devices in another embodiment of the invention.
Figure 3B:
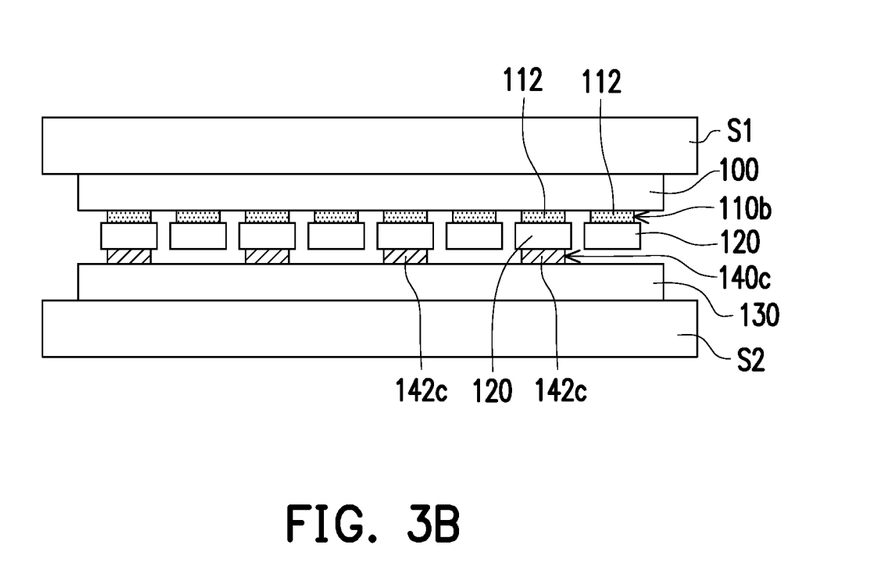
Figure 3C:
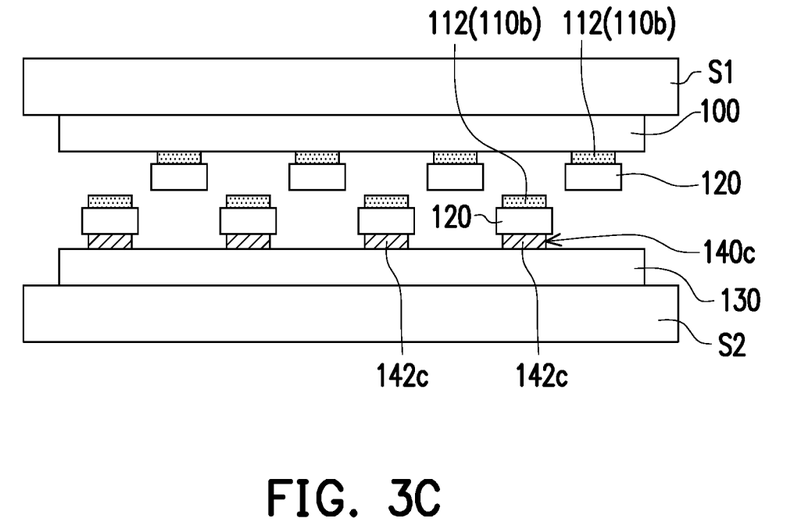

FIG. 3A to FIG. 3C are schematic cross-sectional views of a method of transferring micro devices in another embodiment of the invention. Please refer to FIG. 3A, FIG. 3B, FIG. 2A, and FIG. 2B altogether. The transfer of micro devices of the present embodiment is similar to the transfer of micro devices in FIG. 2A and FIG. 2B. A difference between them lies in: in the step in which the receiving substrate 130 contacts the micro devices 120 on the carrier substrate 100, bonding parts 142c of a bonding layer 140c of the present embodiment are formed on a portion of the micro devices 120. That is to say, the bonding parts 142c of the bonding layer 140c are selectively formed on the micro devices 120. Therefore, when the receiving substrate 130 contacts the micro devices 120 on the carrier substrate 100, only a portion of the micro devices 120 are bonded onto the receiving substrate 130 through the bonding parts 142c of the bonding layer 140c.

Then, please refer to FIG. 3C. Similarly to the step in FIG. 2C, the temperatures of the carrier substrate 100 and the receiving substrate 130 are changed. Due to the temperature difference between the carrier substrate 100 and the receiving substrate 130, a portion of the micro devices 120 are released from the carrier substrate 100 onto the receiving substrate 130. As shown in FIG. 3C, at this moment, a portion of the micro devices 120 remain positioned on the carrier substrate 100 and are not yet transferred onto the receiving substrate 130. In other words, the method of transferring micro devices of the present embodiment may partly or selectively transfer the micro devices 120 on the carrier substrate 100 onto the receiving substrate 130.

Figure 4A:
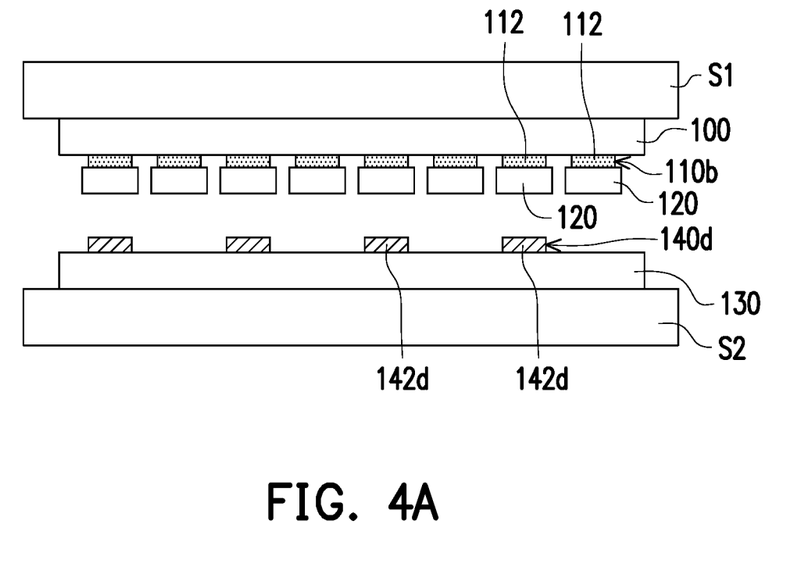
FIG. 4A to FIG. 4C are schematic cross-sectional views of a method of transferring micro devices in another embodiment of the invention.
Figure 4B:
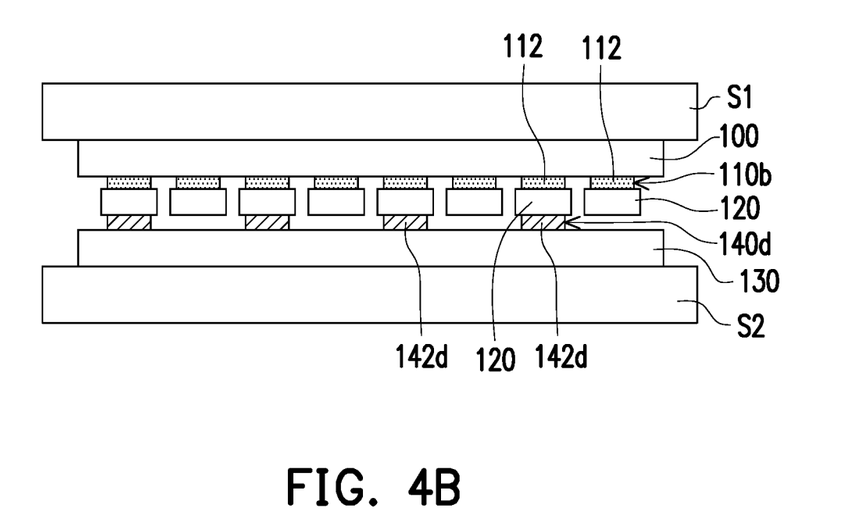
Figure 4C:
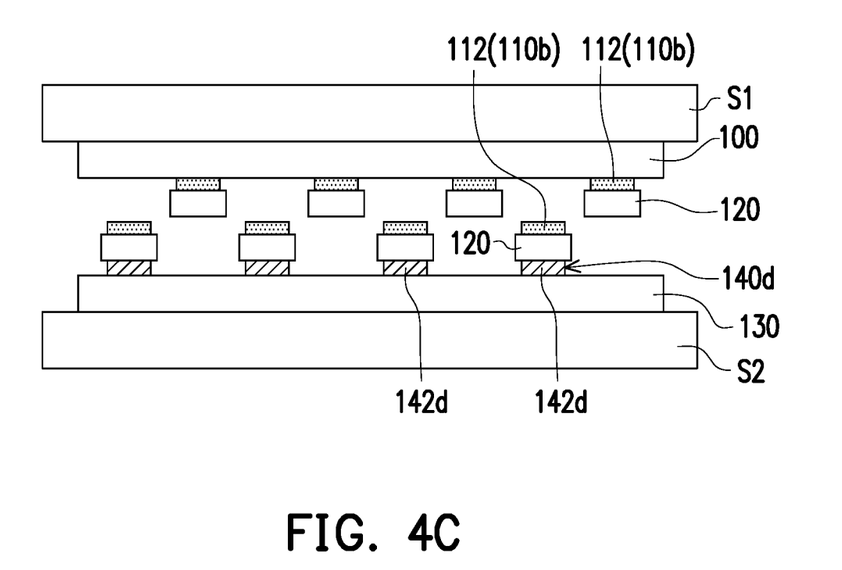

FIG. 4A to FIG. 4C are schematic cross-sectional views of a method of transferring micro devices in another embodiment of the invention. Please refer to FIG. 4A, FIG. 4B, FIG. 2A and FIG. 2B altogether. The transfer of micro devices of the present embodiment is similar to the transfer of micro devices in FIG. 2A and FIG. 2B. A difference between them lies in: in the step in which the receiving substrate 130 contacts the micro devices 120 on the carrier substrate 100, bonding parts 142d of a bonding layer 140d of the present embodiment are formed on the receiving substrate 130 and the bonding parts 142d only correspond to a portion of the micro devices 120. That is to say, the bonding parts 142d of the bonding layer 140d of the present embodiment are selectively formed on the receiving substrate 130. Therefore, when the receiving substrate 130 contacts the micro devices 120 on the carrier substrate 100, only a portion of the micro devices 120 are bonded onto the receiving substrate 130 through the bonding parts 142d of the bonding layer 140d.

Then, please refer to FIG. 4C. Similarly to the step in FIG. 2C, the temperatures of the carrier substrate 100 and the receiving substrate 130 are changed. Due to the temperature difference between the carrier substrate 100 and the receiving substrate 130, a portion of the micro devices 120 are released from the carrier substrate 100 onto the receiving substrate 130. As shown in FIG. 4C, at this moment, a portion of the micro devices 120 remain positioned on the carrier substrate 100 and are not yet transferred onto the receiving substrate 130. In other words, the method of transferring micro devices of the present embodiment may partly or selectively transfer the micro devices 120 on the carrier substrate 100 onto the receiving substrate 130.

Figure 5A:
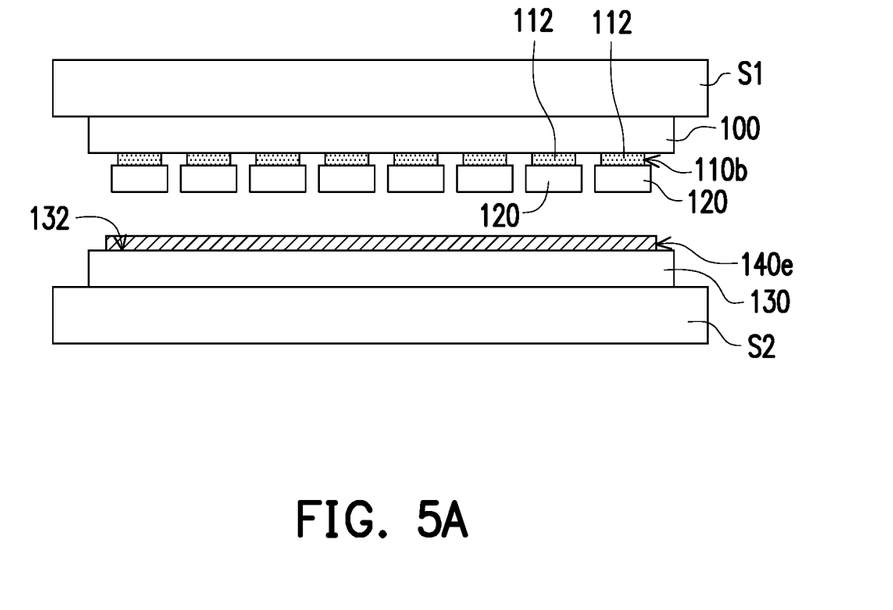
FIG. 5A to FIG. 5C are schematic cross-sectional views of a method of transferring micro devices in another embodiment of the invention.
Figure 5B:
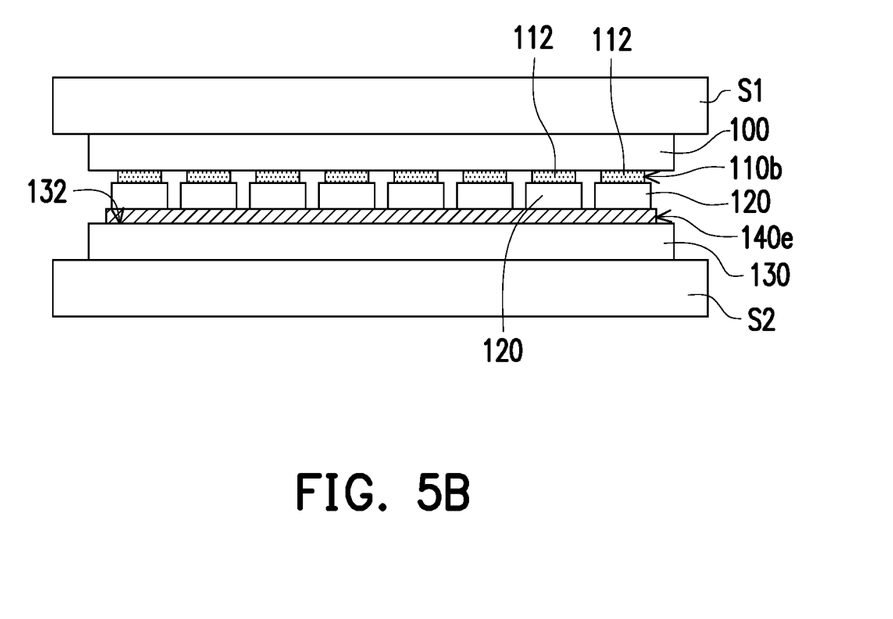
Figure 5C:
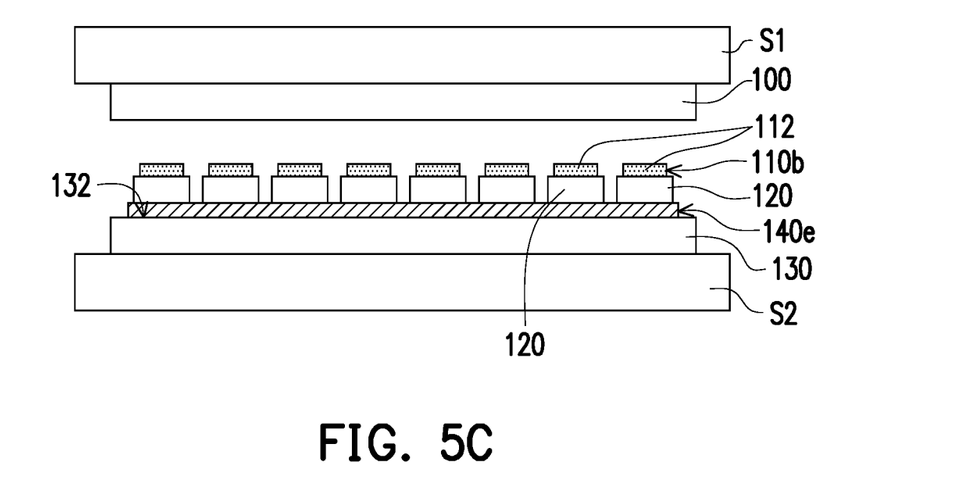

FIG. 5A to FIG. 5C are schematic cross-sectional views of a method of transferring micro devices in another embodiment of the invention. Please refer to FIG. 5A, FIG. 5B, FIG. 2A, and FIG. 2B altogether. The transfer of micro devices of the present embodiment is similar to the transfer of micro devices in FIG. 2A and FIG. 2B. A difference between them lies in: in the step in which the receiving substrate 130 contacts the micro devices 120 on the carrier substrate 100, a bonding layer 140e of the present embodiment is formed on the receiving substrate 130 and entirely covers an upper surface 132 of the receiving substrate 130. That is to say, the bonding layer 140e is an unpatterned structural layer. Therefore, when the receiving substrate 130 contacts the micro devices 120 on the carrier substrate 100, the micro devices 120 are all bonded onto the receiving substrate 130 through the bonding layer 140e.

Then, please refer to FIG. 5C. Similarly to the step in FIG. 2C, the temperatures of the carrier substrate 100 and the receiving substrate 130 are changed. Due to the temperature difference between the carrier substrate 100 and the receiving substrate 130, all of the micro devices 120 are released from the carrier substrate 100 onto the receiving substrate 130. In brief, the method of transferring micro devices of the present embodiment may entirely transfer the micro devices 120 on the carrier substrate 100 onto the receiving substrate 130.

Figure 6A:
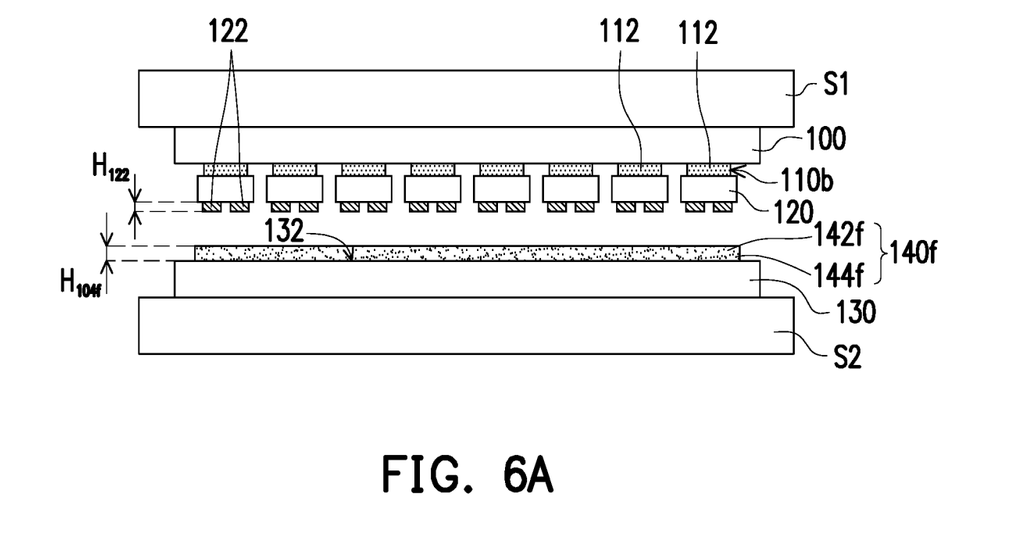
FIG. 6A to FIG. 6C are schematic cross-sectional views of a method of transferring micro devices in another embodiment of the invention.
Figure 6B:
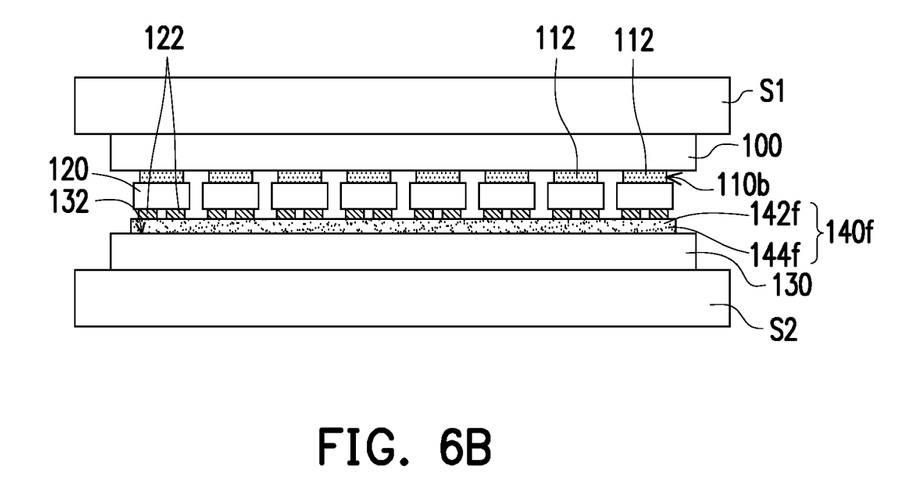
Figure 6C:
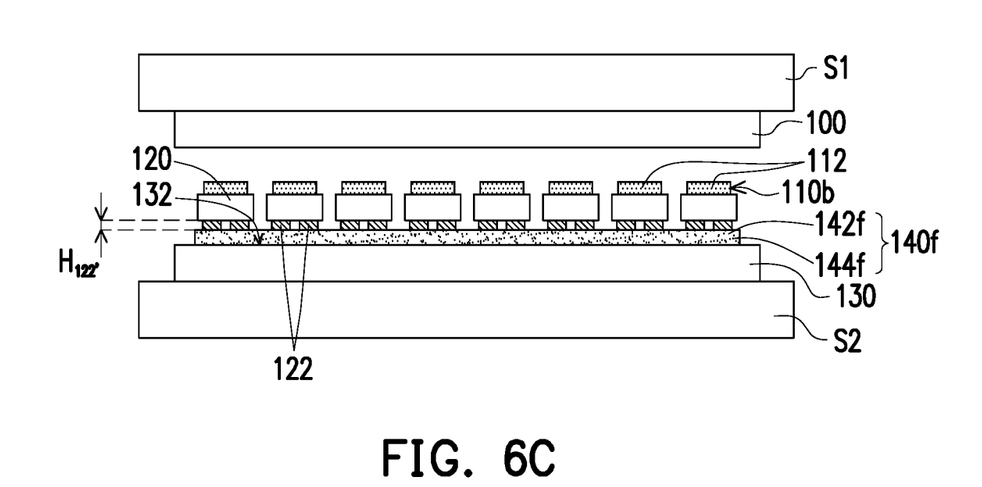

FIG. 6A to FIG. 6C are schematic cross-sectional views of a method of transferring micro devices in another embodiment of the invention. Please refer to FIG. 6A, FIG. 6B, FIG. 5A, and FIG. 5B altogether. The transfer of micro devices of the present embodiment is similar to the transfer of micro devices in FIG. 5A and FIG. 5B. A difference between them lies in: each of the micro devices 120 further includes a plurality of conductive connectors 122. In addition, a bonding layer 140f formed on the receiving substrate 130 may include an insulation film 142f and a plurality of conductive particles 144f. The conductive connectors 122 may be conductive bumps, conductive posts, conductive pillars, or the like. A material of the conductive connectors 122 includes copper, tin, silver, solder, gold, alloys thereof, or a combination thereof. In the present embodiment, before the micro devices 120 are made in contact with the receiving substrate 130 and the bonding layer 140, a thickness $H_{140f}$ of the bonding layer 140 is larger than or equal to a thickness $H_{122}$ of the conductive connectors 122. As illustrated in FIG. 6B, when the receiving substrate 130 contacts the micro devices 120 on the carrier substrate 100, the micro devices 120 are bonded onto receiving substrate 130 through the bonding layer 140f and the conductive connectors 122. In other words, the conductive connectors 122 are directly in contact with the bonding layer 140f. In the present embodiment, when the conductive connectors 122 are made in contact with the bonding layer 140f, at least a portion of each of the conductive connectors 122 is submerged into the bonding layer 140f. In the present embodiment, the conductive particles 144f may be randomly dispersed in the insulation film 142f. The conductive particles 144f may be made of metallic materials. For example, the conductive particles 144f may be copper particles, tin particles, silver particles, solder particles, particles made of an alloy, or the like. On the other hand, the insulation film 142f may include polymeric materials, such as resins. The bonding layer 140f is, for example, an Anisotropic Conductive Film (ACF). However, the invention is not limited thereto. The bonding layer 140f may include other materials in some alternative embodiments.

Then, please refer to FIG. 6C. Similarly to the step in FIG. 5C, the temperatures of the carrier substrate 100 and the receiving substrate 130 are changed. Due to the temperature difference between the carrier substrate 100 and the receiving substrate 130, all of the micro devices 120 are released from the carrier substrate 100 onto the receiving substrate 130. As mentioned above, when the conductive connectors 122 are made in contact with the bonding layer 140f, at least a portion of each of the conductive connectors 122 is submerged into the bonding layer 140f. Therefore, after performing the annealing process on the receiving substrate 130, the submerged portion of the conductive connectors 122 is blended into the bonding layer 140f. As a result, the thickness $H_{122'}$ of each conductive connector 122 after the transferring process may be different from the thickness $H_{122}$ of each conductive connector 122 before the transferring process. Furthermore, as mentioned above, during the transferring process, a pressure may be applied to the system. The pressure may cause the conductive particles 144f to compress, so a size of one of the plurality of the conductive particles 144f after the micro devices 120 are transferred from the carrier substrate 100 onto the receiving substrate 130 is less than or equal to ½ of a size of the one of the plurality of the conductive particles 144f before the micro devices 120 are transferred from the carrier substrate 100 onto the receiving substrate 130. The compression of the conductive particles 144f may further aids the electrical connection between the micro devices 120 and the receiving substrate 130. In brief, the method of transferring micro devices of the present embodiment may entirely transfer the micro devices 120 on the carrier substrate 100 onto the receiving substrate 130.

Figure 7A:
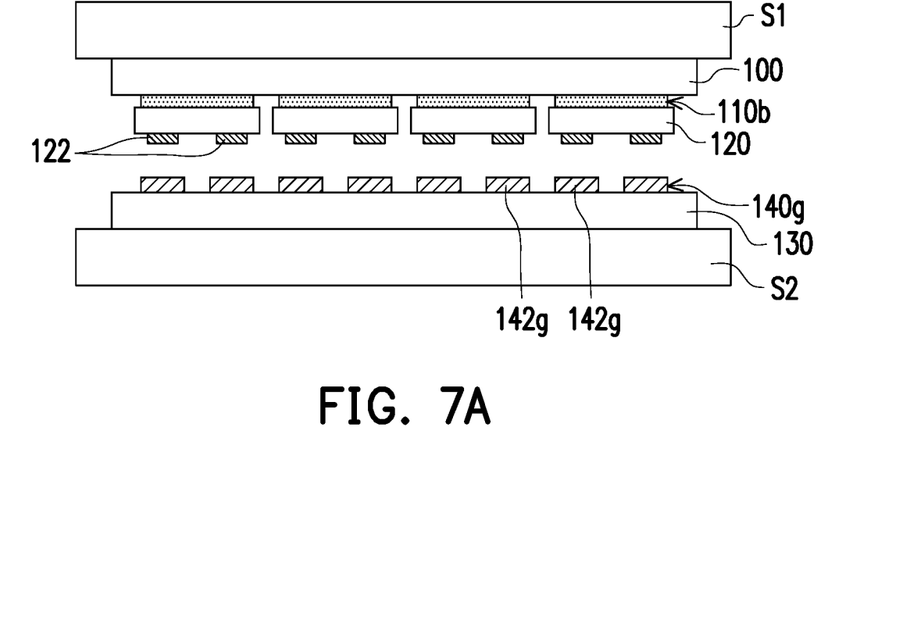
FIG. 7A to FIG. 7C are schematic cross-sectional views of a method of transferring micro devices in another embodiment of the invention.
Figure 7B:
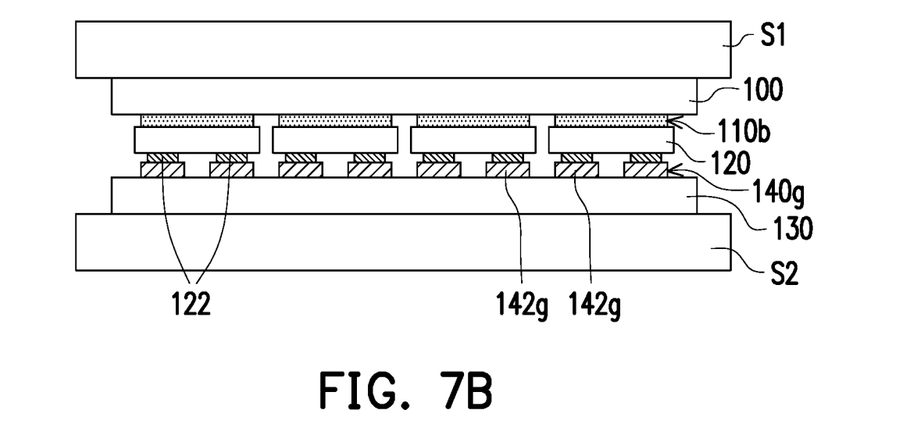
Figure 7C:
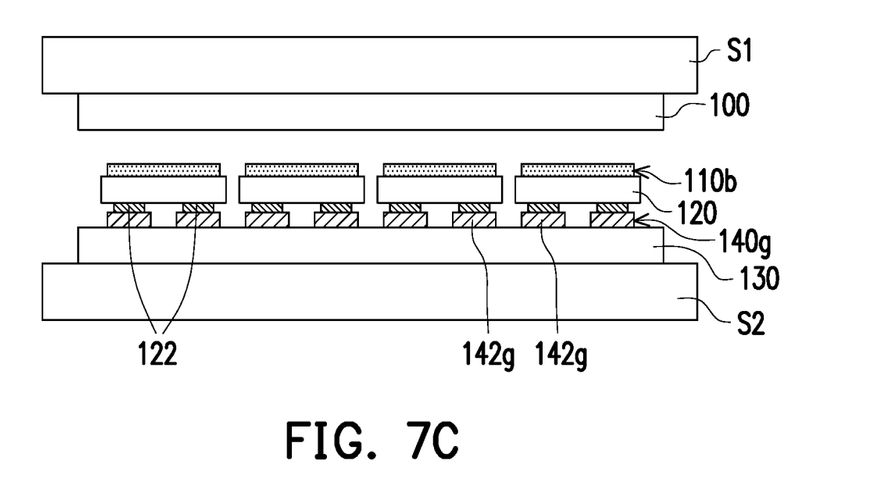

FIG. 7A to FIG. 7C are schematic cross-sectional views of a method of transferring micro devices in another embodiment of the invention. Please refer to FIG. 7A, FIG. 7B, FIG. 6A, and FIG. 6B altogether. The transfer of micro devices of the present embodiment is similar to the transfer of micro devices in FIG. 6A and FIG. 6B. A difference between them lies in: in the step in which the receiving substrate 130 contacts the micro devices 120 on the carrier substrate 100, a bonding layer 140g having a plurality of bonding parts 142g is foil led on the receiving substrate 130. In other words, the bonding layer 140g is a patterned layer. In the present embodiment, the bonding parts 142g correspond to the conductive connectors 122 of the micro devices 120. For example, as illustrated in FIG. 7B, the conductive connectors 122 of the micro devices 120 are connected to the bonding parts 142g in a one-to-one manner. That is, the number of the bonding parts 142g are the same as the number of the conductive connectors 122. However, the invention is not limited thereto. In some alternative embodiments, the bonding parts 142g and the conductive connectors 122 are not connected to each other in a one-to-one manner. For example, in some alternative embodiments, one bonding part 142g may correspond to multiple conductive connectors 122 of the micro devices 120. Although not illustrated, the bonding layer 140g may be similar to the bonding layer 140f in FIG. 6A to FIG. 6B. In other words, the bonding layer 140g may also include an insulating film and a plurality of conductive particles dispersed in the insulating film. However, the disclosure is not limited thereto. In some alternative embodiments, the bonding layer 140g may be similar to the bonding layer 140a in FIG. 1A to FIG. 1C.

Then, please refer to FIG. 7C. Similarly to the step in FIG. 6C, the temperatures of the carrier substrate 100 and the receiving substrate 130 are changed. Due to the temperature difference between the carrier substrate 100 and the receiving substrate 130, all of the micro devices 120 are released from the carrier substrate 100 onto the receiving substrate 130. In brief, the method of transferring micro devices of the present embodiment may entirely transfer the micro devices 120 on the carrier substrate 100 onto the receiving substrate 130.

In summary, in the method of transferring micro devices in the invention, the receiving substrate contacts the micro devices on the carrier substrate that are in a number ranging from 1000 to 2000000. Then, by changing the temperature of at least one of the carrier substrate and the receiving substrate, at least a portion of the micro devices on the carrier substrate are released onto the receiving substrate, thereby completing the transfer of the micro devices. Compared with the conventional method of transferring LEDs through the force at a distance such as electrostatic force or magnetic force, the method of transferring micro devices in the invention achieves bulk transfer of micro devices and has an advantage of high transferring efficiency.

It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A method of transferring micro devices, comprising:
providing a carrier substrate, on which a buffer layer and a plurality of micro devices are disposed, the buffer layer being located between the carrier substrate and the micro devices, the micro devices being separated from one another and positioned on the carrier substrate through the buffer layer;
making a receiving substrate contact the micro devices on the carrier substrate; and
changing a temperature of at least one of the carrier substrate and the receiving substrate after the micro devices contact the receiving substrate, wherein at least a portion of the micro devices are transferred from the carrier substrate onto the receiving substrate after changing the temperature of at least one of the carrier substrate and the receiving substrate,
wherein making the receiving substrate contact the micro devices on the carrier substrate comprises providing a bonding layer between the micro devices and the receiving substrate, the micro devices contacting the receiving substrate through the bonding layer,
wherein each micro device comprises a plurality of conductive connectors, and when the conductive connectors of each micro device are made in contact with the bonding layer, at least a portion of each of the conductive connectors is submerged into the bonding layer.

2. The method of transferring micro devices as recited in claim 1, wherein changing the temperature of at least one of the carrier substrate and the receiving substrate comprises:
changing the temperature of the carrier substrate to reduce bonding force between the at least a portion of the micro devices and the carrier substrate.

3. The method of transferring micro devices as recited in claim 2, wherein changing the temperature of at least one of the carrier substrate and the receiving substrate further comprises:
changing the temperature of the receiving substrate to enhance the bonding force between the at least a portion of the micro devices and the receiving substrate after changing the temperature of the carrier substrate to reduce the bonding force between the at least a portion of the micro devices and the carrier substrate.

4. The method of transferring micro devices as recited in claim 2, after changing the temperature of at least one of the carrier substrate and the receiving substrate and before the at least a portion of the micro devices are transferred from the carrier substrate onto the receiving substrate, the method further comprises:
removing the carrier substrate from the micro devices, so that at least a portion of the micro devices are transferred from the carrier substrate onto the receiving substrate.

5. The method of transferring micro devices as recited in claim 4, wherein removing the carrier substrate from the micro devices comprises performing a laser ablation process, an ultraviolet light irradiating process, a solution decomposition process, a thermal decomposition process, or a combination thereof.

6. The method of transferring micro devices as recited in claim 2, wherein changing the temperature of at least one of the carrier substrate and the receiving substrate comprises elevating the temperature of at least one of the carrier substrate and the receiving substrate in a ramping manner.

7. The method of transferring micro devices as recited in claim 2, wherein changing the temperature of at least one of the carrier substrate and the receiving substrate comprises elevating the temperature of at least one of the carrier substrate and the receiving substrate in a continuous manner.

8. The method of transferring micro devices as recited in claim 2, further comprising applying a pressure to the carrier substrate.

9. The method of transferring micro devices as recited in claim 8, wherein the pressure is applied in a ramping manner.

10. The method of transferring micro devices as recited in claim 8, wherein the pressure is applied in a continuous manner.

11. The method of transferring micro devices as recited in claim 1, wherein the bonding layer comprises an insulating film and a plurality of conductive particles, and the conductive particles are dispersed in the insulating film.

12. The method of transferring micro devices as recited in claim 11, wherein a size of one of the conductive particles after the portion of the micro devices are transferred from the carrier substrate onto the receiving substrate is less than or equal to ½ of a size of the one of the conductive particles before the portion of the micro devices are transferred from the carrier substrate onto the receiving substrate.

13. The method of transferring micro devices as recited in claim 1, wherein a thickness of the bonding layer is larger than or equal to a thickness of the conductive connectors before the portion of the micro devices are transferred from the carrier substrate onto the receiving substrate.

14. The method of transferring micro devices as recited in claim 1, wherein the bonding layer comprises a plurality of bonding parts, and the bonding parts correspond to the conducive connectors.

15. The method of transferring micro devices as recited in claim 1, further comprising:
changing a temperature of at least one of the carrier substrate and the receiving substrate before making the receiving substrate contact the micro devices on the carrier substrate.

16. The method of transferring micro devices as recited in claim 15, wherein changing the temperature of at least one of the carrier substrate and the receiving substrate before making the receiving substrate contact the micro devices on the carrier substrate comprises elevating the temperature of the at least one of the carrier substrate and the receiving substrate in a ramping manner.

17. The method of transferring micro devices as recited in claim 15, wherein changing the temperature of at least one of the carrier substrate and the receiving substrate before making the receiving substrate contact the micro devices on the carrier substrate comprises elevating the temperature of at least one of the carrier substrate and the receiving substrate in a continuous manner.

18. The method of transferring micro devices as recited in claim 15, wherein a change in temperature of at least one of the carrier substrate and the receiving substrate before making the receiving substrate contact the micro devices on the carrier substrate is smaller than a change in temperature of the at least one carrier substrate and the receiving substrate after making the receiving substrate contact the micro devices on the carrier substrate.

19. The method of transferring micro devices as recited in claim 15, wherein a change in temperature of the at least one of the carrier substrate and the receiving substrate before making the receiving substrate contact the micro devices on the carrier substrate is less than or equal to 100 degree Celsius.

* * * * *